United States Patent [19]
Shamarao

[11] Patent Number: 6,091,260
[45] Date of Patent: Jul. 18, 2000

[54] INTEGRATED CIRCUIT OUTPUT BUFFERS HAVING LOW PROPAGATION DELAY AND IMPROVED NOISE CHARACTERISTICS

[75] Inventor: Prashant Shamarao, Atlanta, Ga.

[73] Assignee: Integrated Device Technology, Inc., Santa Clara, Calif.

[21] Appl. No.: 09/191,141

[22] Filed: Nov. 13, 1998

[51] Int. Cl.[7] .............................................. H03K 17/16
[52] U.S. Cl. .................................. 326/27; 326/83; 326/57
[58] Field of Search .............................. 326/83, 86, 87, 326/56–58, 26, 27

[56] References Cited

U.S. PATENT DOCUMENTS

| | | | |
|---|---|---|---|
| 4,758,743 | 7/1988 | Dehganpour et al. | 307/443 |
| 4,785,201 | 11/1988 | Martinez | 307/443 |
| 4,797,579 | 1/1989 | Lewis | 307/443 |
| 4,825,099 | 4/1989 | Barton | 307/270 |
| 4,857,863 | 8/1989 | Ganger et al. | 330/264 |
| 4,862,018 | 8/1989 | Taylor et al. | 307/443 |
| 4,906,867 | 3/1990 | Petty | 307/443 |
| 4,908,528 | 3/1990 | Huang | 307/443 |
| 4,924,115 | 5/1990 | Yazdy | 307/443 |
| 4,931,668 | 6/1990 | Kikuda et al. | 307/443 |
| 4,959,561 | 9/1990 | McDermott et al. | 307/443 |
| 4,973,861 | 11/1990 | Dikken | 307/443 |
| 4,983,860 | 1/1991 | Yim et al. | 307/443 |
| 5,013,940 | 5/1991 | Ansel | 307/473 |
| 5,028,818 | 7/1991 | Go Ang et al. | 307/443 |
| 5,063,308 | 11/1991 | Borkar | 307/443 |
| 5,081,374 | 1/1992 | Davis | 307/451 |
| 5,097,149 | 3/1992 | Lee | 326/87 |
| 5,111,064 | 5/1992 | Ward | 307/270 |
| 5,122,690 | 6/1992 | Bianchi | 326/87 |
| 5,149,991 | 9/1992 | Rogers | 307/443 |
| 5,216,291 | 6/1993 | Seevinck et al. | 307/296.6 |
| 5,237,213 | 8/1993 | Tanoi | 307/290 |
| 5,241,221 | 8/1993 | Fletcher et al. | 307/263 |
| 5,253,205 | 10/1993 | Eaton, Jr. | 365/189.06 |
| 5,291,443 | 3/1994 | Lim | 365/189.04 |
| 5,319,252 | 6/1994 | Pierce et al. | |
| 5,319,258 | 6/1994 | Ruetz | 307/443 |
| 5,319,260 | 6/1994 | Wanlass | 307/443 |
| 5,347,177 | 9/1994 | Lipp | |
| 5,352,939 | 10/1994 | Hirabayashi et al. | 307/443 |

(List continued on next page.)

OTHER PUBLICATIONS

Furutani et al., *An Adjustable Output Driver With a Self-Recovering Vpp Generator for a 4M × 16 DRAM*, IEEE Journal of Solid–State Circuits, vol. 29, No. 3, Mar 1994, pp. 308–310.

Senthinathan et al., *Application Specific CMOS Output Driver Circuit Design Techniques to Reduce Simultaneous Switching Noise*, IEEE Journal of Solid–State Circuits, vol. 28, No. 12, Dec. 1993, pp. 1383–1388.

Miyaji et al., *A 25-ns 4-Mbit CMOS SRAM With Dynamic Bit Line Loads*, IEEE Journal of Solid–State Circuits, vol. 24, No. 5, Oct. 1989, pp. 1213–1218.

(List continued on next page.)

*Primary Examiner*—Jon Santamauro
*Assistant Examiner*—Don Pho Le
*Attorney, Agent, or Firm*—Myers Bigel Sibley & Sajovec

[57] ABSTRACT

Integrated circuit output buffers include first and second pull-down switches and a preferred pull-down control circuit which utilizes a preferred feedback technique to facilitate a reduction in simultaneous-switching noise during pull-down operations and also improve the impedance matching characteristics of the output buffers during DC conditions. The preferred feedback technique also limits the degree to which external noise can influence operation of the pull-down control circuit. First and second pull-up switches and a pull-up control circuit are also provided to improve simultaneous-switching noise and impedance matching characteristics during pull-up operations in a similar manner. The first and second pulldown switches are electrically connected in parallel between an output of the buffer and a first reference signal line (e.g., Vss) and the first and second pull-up switches are electrically connected in parallel between an output of the buffer and a second reference signal line (e.g., Vdd). The pull-down and pull-up switches may comprise NMOS and PMOS transistors, respectively.

41 Claims, 3 Drawing Sheets

U.S. PATENT DOCUMENTS

| | | | |
|---|---|---|---|
| 5,367,481 | 11/1994 | Takase et al. | 365/149 |
| 5,414,379 | 5/1995 | Kwon | 327/170 |
| 5,416,743 | 5/1995 | Allan et al. | 365/203 |
| 5,418,739 | 5/1995 | Takasugi | 365/149 |
| 5,426,376 | 6/1995 | Wong et al. | 326/27 |
| 5,430,404 | 7/1995 | Campbell et al. | 327/566 |
| 5,432,471 | 7/1995 | Majumdar et al. | 327/380 |
| 5,438,277 | 8/1995 | Sharpe-Geisler | 326/27 |
| 5,451,861 | 9/1995 | Giebel | 323/315 |
| 5,483,177 | 1/1996 | Van Lieverloo | 326/27 |
| 5,489,861 | 2/1996 | Seymour | 327/108 |
| 5,517,142 | 5/1996 | Jang et al. | 327/108 |
| 5,534,790 | 7/1996 | Huynh et al. | 326/27 |
| 5,537,060 | 7/1996 | Baek | 326/87 |
| 5,546,033 | 8/1996 | Campbell et al. | 327/170 |
| 5,568,081 | 10/1996 | Lui et al. | 327/380 |
| 5,570,044 | 10/1996 | Martin et al. | 326/84 |
| 5,604,453 | 2/1997 | Pedersen | 327/112 |
| 5,656,960 | 8/1997 | Holzer | 327/170 |
| 5,717,343 | 2/1998 | Kwong | 326/83 |
| 5,786,709 | 7/1998 | Kirsch et al. | 326/27 |
| 5,828,260 | 10/1998 | Taniguchi et al. | 327/387 |
| 5,838,177 | 11/1998 | Keeth | 327/108 |
| 5,843,813 | 12/1998 | Wei et al. | 438/200 |
| 5,877,647 | 3/1999 | Vajapey et al. | 327/391 |
| 5,887,150 | 3/1999 | Schneider et al. | 395/306 |
| 5,894,238 | 4/1999 | Chien | 327/112 |
| 5,900,770 | 5/1999 | Sabin | 327/519 |
| 5,910,874 | 6/1999 | Iniewski et al. | 361/56 |
| 5,977,790 | 11/1999 | Sanwo et al. | 326/87 |
| 6,014,046 | 1/2000 | Douse et al. | 326/87 |

OTHER PUBLICATIONS

Texas Instruments, "High–Speed, Low Voltage Logic Family from Texas Instruments is First to Achieve Sub–Two Nanosecond Propagation Delay", 1998, 2 pp.

Texas Instruments, *"SN74AVC16244 16–Bit Buffer/Driver With 3–State Outputs"*, Sep. 1998.

Texas Instruments, *"Dynamic Output Control (DOC™) Circuitry Technology and Applications"*, Aug. 1998.

Texas Instruments, *"AVC Logic Family Technology and Applications"*, Aug. 1998.

INTEGRATED CIRCUIT OUTPUT BUFFERS HAVING LOW PROPAGATION DELAY AND IMPROVED NOISE CHARACTERISTICS

FIELD OF THE INVENTION

The present invention relates to integrated circuit devices, and more particularly to integrated circuit output buffers.

BACKGROUND OF THE INVENTION

Integrated circuits typically include buffer circuits therein for driving on-chip and off-chip loads. Dynamic output control (DOC) can also be provided by output buffers, such as those disclosed in application notes by Texas Instruments, Inc. (see, hftp://www.ti.com/sc/AVC). In particular, these output buffers having DOC circuitry may provide variable output impedance to reduce signal noise during output transitions. In these buffers, the DOC circuitry is stated as providing enough current to achieve high signaling speeds, while also having the ability to quickly switch the impedance level to reduce the undershoot and overshoot noise that is often found in high-speed logic. Such DOC circuitry may be used advantageously to eliminate the need for damping resistors which can limit noise only at the expense of increases in propagation delay. Notwithstanding such conventional output buffers with DOC circuitry, however, there still exists a need for output buffers which have excellent noise, propagation delay and impedance matching characteristics.

SUMMARY OF THE INVENTION

It is therefore an object of the present invention to provide improved integrated circuit output buffers.

It is another object of the present invention to provide integrated circuit output buffers having low propagation delay.

It is still another object of the present invention to provide integrated circuit output buffers having improved simultaneous-switching noise characteristics.

It is yet another object of the present invention to provide integrated circuit output buffers having reduced supply line-to-output coupling and improved impedance matching characteristics during DC operation.

These and other objects, advantages and features of the present invention are provided by integrated circuit output buffers which comprise first and second pull-down switches and a pull-down control circuit which utilizes a preferred feedback technique to facilitate a reduction in simultaneous-switching noise during pull-down operations and also improve the impedance matching characteristics of the output buffers during DC conditions. The preferred feedback technique also limits the degree to which external noise can influence operation of the pull-down control circuit. First and second pull-up switches and a pull-up control circuit are also provided to improve simultaneous-switching noise and impedance matching characteristics during pull-up operations in a similar manner.

In particular, the first and second pull-down switches are electrically connected in parallel between an output of the buffer and a first reference signal line (e.g., Vss) and the first and second pull-up switches are electrically connected in parallel between output of the buffer and a second reference signal line (e.g., Vdd). The pull-down and pull-up switches may comprise NMOS and PMOS transistors, respectively. The pull-down control circuit also provides for enhanced noise and impedance matching characteristics by (i) closing the first and second pull-down switches during a first portion of a pull-down time interval, and then (ii) using a signal fed back directly from an input of the second pull-down switch to open the second pull-down switch while maintaining the first pull-down switch closed during a second portion of the pull-down time interval. Likewise, during pull-up, the pull-up control circuit closes the first and second pull-up switches during a first portion of a pull-up time interval and then uses a signal fed back directly from an input of the second pull-up switch to open the second pull-up switch while maintaining the first pull-up switch closed during a second portion of the pull-up time interval.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may referred to by the same reference symbols.

Figure 1:
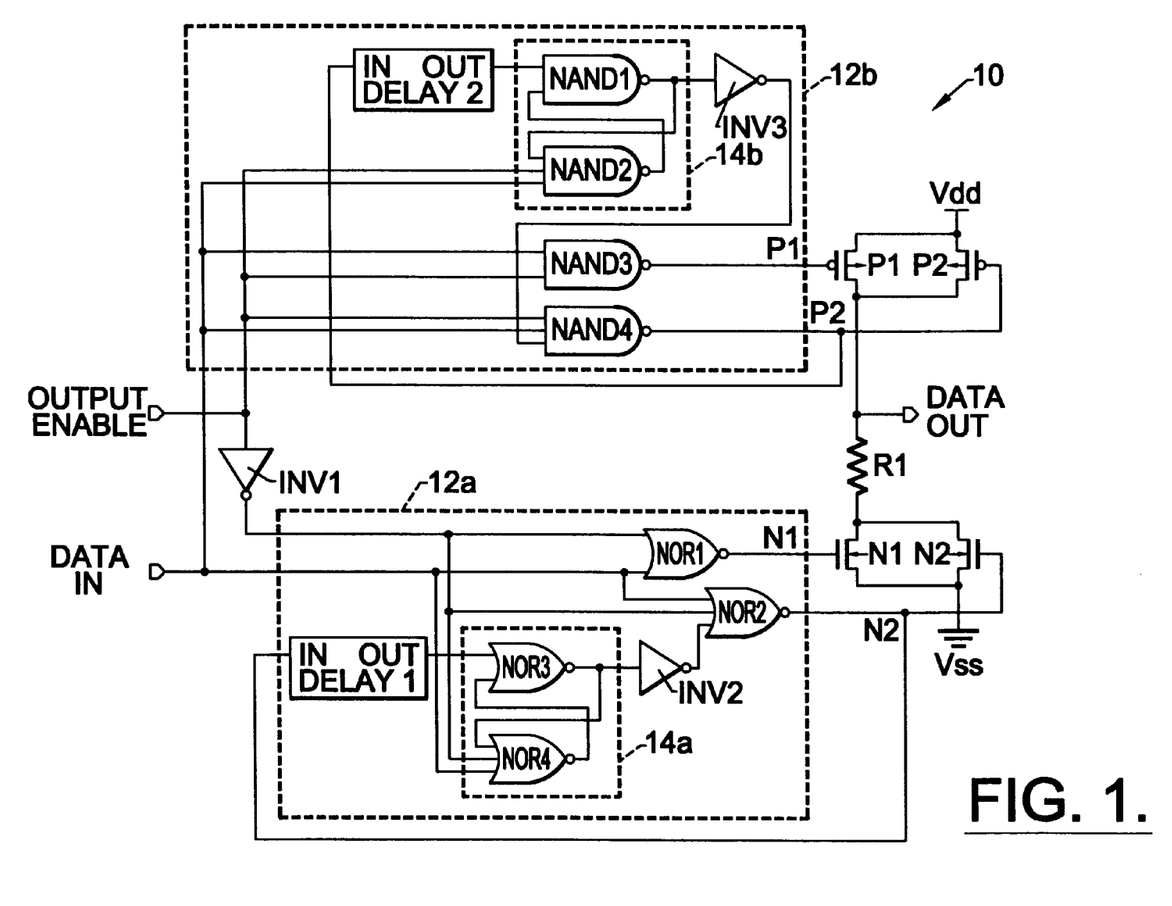
FIG. 1 is an electrical schematic of an integrated circuit output buffer according to a preferred embodiment of the present invention.
Figure 2:
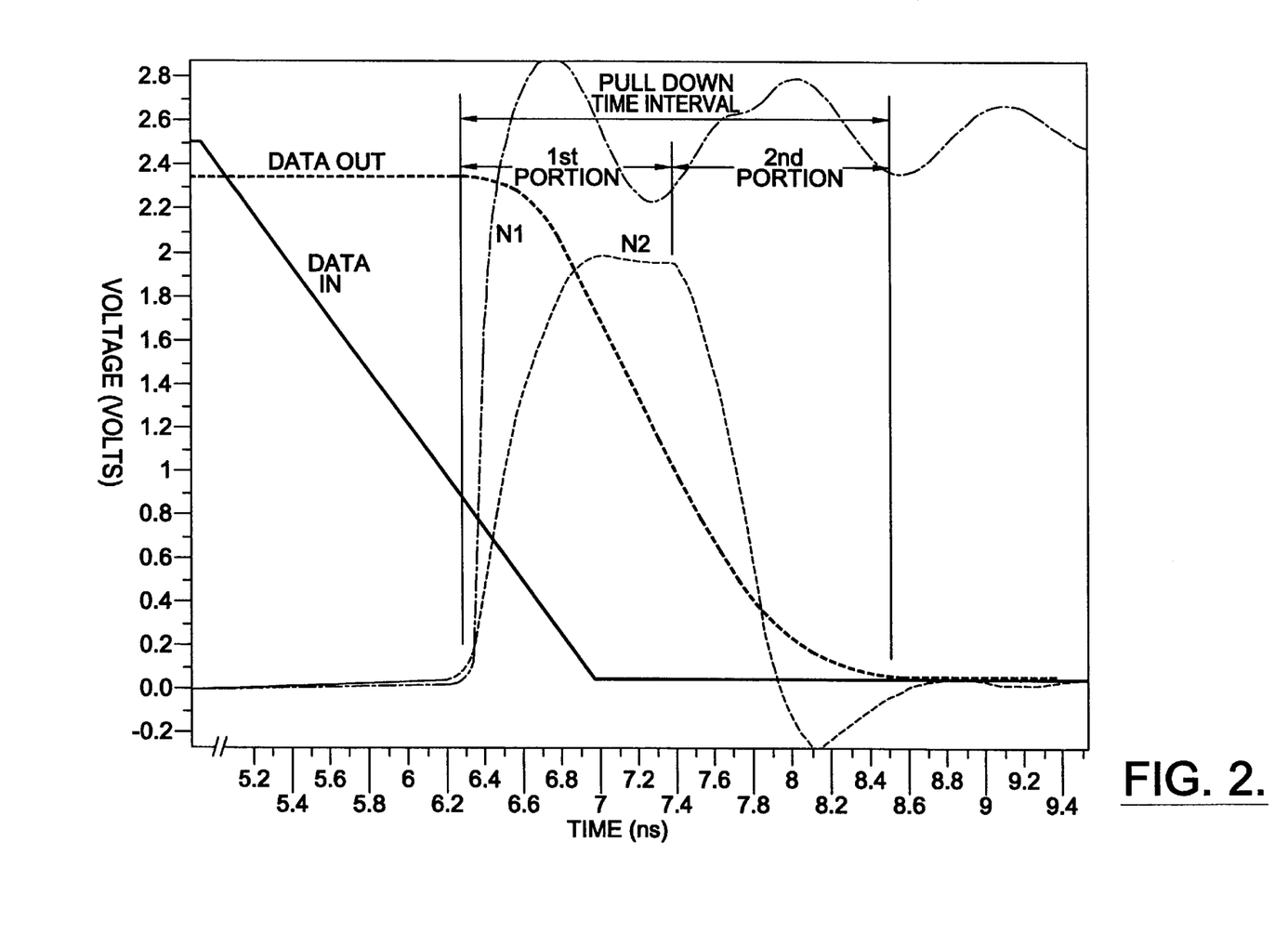
FIG. 2 is a timing diagram which illustrates the operation of the output buffer of FIG. 1.

Referring now to FIGS. 1–2, an integrated circuit output buffer 10 according to a preferred embodiment of the present invention passes an input signal (DATA IN) as an output signal (DATA OUT) with low propagation delay when the buffer 10 is enabled (i.e., OUTPUT ENABLE=1). The preferred buffer 10 includes first and second pull-down switches which are electrically connected in parallel. As illustrated, the first and second pull-down switches may comprise NMOS pull-down transistors N1 and N2. These pull-down transistors each have first terminals (drain electrodes) which are electrically connected to an output signal line (DATA OUT) by a resistor R1. This resistor R1 provides electrostatic discharge (ESD) protection and may have a value of 10Ω, for example. The second terminals (i.e., source electrodes) of the pull-down transistors N1 and N2 are also electrically connected to a first reference signal line (e.g., Vss≦Gnd). A pull-down control circuit 12a is also provided to control the turn-on and turn-off of the pull-down transistors N1 and N2 in a preferred manner to reduce simultaneous-switching noise by reducing the degree of coupling between the output signal line (DATA OUT) and the first reference signal line Vss at the end of each pull-down transition. The preferred pull-down control circuit 12a can also be operated in a preferred manner to match the impedance of the pull-down path to the impedance of the load being driven by the output buffer.

To illustrate this preferred pull-down method, a quiescent DC condition can be initially established with the input signal line (DATA IN) set to a logic 1 level (while OUTPUT ENABLE=1). Once this condition has been established, the outputs of inverters INV1 and INV2, the outputs of the multi-input logic gates NOR1, NOR2 and NOR4 and the output of the first delay device (DELAY 1) will all be set to logic 0 levels and the output of the multi-input logic gate NOR3 will be set to a logic 1 level. Here, the multi-input logic gates NOR3 and NOR4 are configured as a first multi-input latch 14a.

If the input signal line (DATA IN) then transitions from 1→0, the pull-down control circuit 12a will initially turn on both of the NMOS pull-down transistors N1 and N2 during a first portion of a pull-down time interval by driving signal lines N1 and N2 from 0→1, as illustrated by FIG. 2. In particular, once the input signal line (DATA IN) initially transitions to a logic 0 level (with OUTPUT ENABLE=1), all the inputs to the multi-input logic gates NOR1 and NOR2 will be set to logic 0 levels and the outputs of the pull-down control circuit 12a (i.e., signal lines N1 and N2) will be set to logic 1 levels. This action by the pull-down control circuit 12a results in the formation of a low resistance pull-down path between the output signal line (DATA OUT) and the first reference signal line Vss. The value of this low resistance path during the first portion of the pull-down time interval is defined as the sum of the resistance of resistor R1 and the on-state resistance of the parallel combination of transistors N1 and N2 (which may have different respective on-state resistances). The value of resistor R1 and the widths of transistors N1 and N2 can also be chosen to obtain desired propagation delay characteristics during the first portion of the pull-down time interval (e.g., to obtain fast initial pull-down of the output signal line (DATA OUT)).

The preferred pull-down control circuit 12a also provides smooth monotonic pull-down of the output signal line (DATA OUT) and reduces simultaneous-switching noise by turning off transistor N2 during a second portion of the pull-down time interval by driving signal line N2 from 1→0, as illustrated by FIG. 2. This action by the pull-down control circuit 12a increases the effective resistance of the pull-down path between the output signal line (DATA OUT) and the first reference signal line Vss and thereby reduces the degree of electrical coupling between these signal lines during the latter portion of the pull-down time interval. The output signal line (DATA OUT) can therefore be made less susceptible to noise caused by "ground bounce" fluctuations on the first reference signal line Vss. In addition, the size of the NMOS pull-down transistor N1 can be independently optimized to obtain excellent impedance matching during DC conditions.

This advantageous function of the pull-down control circuit 12a is preferably achieved by feeding back signal line N2 directly as an input of the pull-down control circuit 12a. The 0→1 transition on this fed back input is then delayed using a first delay device DELAY 1 which provides a predetermined delay (e.g., ~1–1.5 ns). As illustrated best by FIG. 2, if the delay provided by the first delay device DELAY 1 is of sufficient duration, the timing of the commencement of the second portion of the pull-down time interval (i.e., when signal line N2 starts to transition back from 1→0) can be made to occur after the output signal line (DATA OUT) has transitioned below a threshold logic 0 level for purposes of switching devices having inputs electrically connected to the output signal line (i.e., $V_{DATA\ OUT} \leq V_{IL}$, where $V_{IL}$ is defined as the maximum input voltage that will be unambiguously recognized as a logic 0 signal by a device being driven by the output signal line).

Based on this preferred aspect of the pull-down control circuit 12a, the initial 0→1 transition of signal line N2 during the first portion of the pull-down time interval will translate into a delayed 0→1 transition at an input of the first latch 14a. This 0→1 transition will then cause the output of the multi-input logic gate NOR3 to transition from 1→0 and the output of inverter INV2 to transition from 0→1. In response to these transitions, the output of the multi-input logic gate NOR2 will switch from 1→0 at the commencement of the second portion of the pull-down time interval, to turn-off NMOS pull-down transistor N2 and thereby increase the effective resistance of the pull-down path after the voltage on the output signal line (DATA OUT) has dropped below $V_{IL}$. This increase in the resistance of the pull-down path lessens the degree to which ground bounce fluctuations will be represented as noise on the output signal line (DATA OUT). Notwithstanding this increase in resistance of the pull-down path during the second portion of the pull-down time interval, the use of direct feedback from the gate electrode of NMOS pull-down transistor N2 to the input of the first delay unit DELAY 1 facilitates smooth monotonic pull-down of the output signal line during the entire pull-down time interval. The use of the first latch 14a also precludes the fed back input from oscillating.

Referring again to FIG. 1, the preferred buffer 10 may also include first and second pull-up switches which are electrically connected in parallel. These first and second pull-up switches may comprise PMOS pull-up transistors P1 and P2, connected as illustrated. A pull-up control circuit 12b is also provided to control the turn-on and turn-off of the pull-up transistors P1 and P2 in a preferred manner to reduce simultaneous-switching noise by reducing the degree of coupling between the output signal line (DATA OUT) and the second reference signal line Vdd at the end of each pull-up transition. Preferred impedance matching characteristics may also be achieved. For example, a quiescent DC condition can be initially established with the input signal line (DATA IN) set to a logic 0 level (while OUTPUT ENABLE=1). Once this condition has been established, the outputs of inverter INV3, the outputs of the multi-input logic gates NAND2, NAND3 and NAND4 and the output of the second delay device (DELAY 2) will all be set to logic 1 levels and the output of the multi-input logic gate NAND1 will be set to a logic 0 level. Here, the multi-input logic gates NAND1 and NAND2 are configured as a second multi-input latch 14b.

If the input signal line (DATA IN) then transitions from 0→1, the pull-up control circuit 12b will initially turn on both of the PMOS pull-up transistors P1 and P2 during a first portion of a pull-up time interval by driving signal lines P1 and P2 from 1→0. Once the input signal line (DATA IN) initially transitions to a logic 1 level (with OUTPUT ENABLE=1), all the inputs to the multi-input logic gates NAND1 and NAND2 will be set to logic 1 levels and the outputs of the pull-up control circuit 12b (i.e., signal lines P1 and P2) will be set to logic 0 levels. This action by the pull-up control circuit 12b results in the formation of a low resistance pull-up path between the output signal line (DATA OUT) and the second reference signal line Vdd. The value of this low resistance path during the first portion of the pull-up time interval is equivalent to the on-state resistance of the parallel combination of PMOS transistors P1 and P2. Here, the on-state resistance of each of the PMOS transistors P1 and P2 may be chosen to obtain desired propagation delay characteristics during the first portion of the pull-up time interval (e.g., to obtain fast initial pull-up) and desired impedance matching characteristics at the completion of the pull-up time interval.

The preferred pull-up control circuit 12b also provides smooth monotonic pull-up of the output signal line (DATA OUT) and reduces simultaneous-switching noise by turning off PMOS pull-up transistor P2 during a second portion of the pull-up time interval by driving signal line P2 from 0→1. This action by the pull-up control circuit 12b increases the effective resistance of the pull-up path between the output signal line (DATA OUT) and the second reference signal line Vdd and thereby reduces the degree of electrical coupling between these signal lines during the latter portion of the pull-up time interval. The output signal line (DATA OUT) can therefore be made less susceptible to noise caused by "supply/Vdd bounce" fluctuations on the second reference signal line Vdd.

As illustrated by FIG. 1, this advantageous function of the pull-up control circuit 12b is preferably achieved by feeding back signal line P2 directly as an input of the pull-up control circuit 12b. The 1→0 transition on this fed back input is then delayed using a second delay device DELAY 2 which provides a predetermined delay (e.g., ~1–1.5 ns). Like the above discussion provided with respect to FIG. 2, if the delay provided by the delay device DELAY 2 is of sufficient duration, the timing of the commencement of the second portion of the pull-up time interval (i.e., when signal line P2 starts to transition back from 0→1) can be made to occur after the output signal line (DATA OUT) has transitioned above a threshold logic 1 level for purposes of switching devices having inputs electrically connected to the output signal line (i.e., $V_{DATA\ OUT} \geq V_{IH}$, where $V_{IH}$ is defined as the minimum input voltage that will be unambiguously recognized as a logic 1 signal by a device being driven by the output signal line).

Based on this preferred aspect of the pull-up control circuit 12b, the initial 1→0 transition of signal line P2 during the first portion of the pull-up time interval will translate into a delayed 1→0 transition at an input of the second latch 14b. This 1→0 transition will then cause the output of the multi-input logic gate NAND1 to transition from 0→1 and the output of inverter INV3 to transition from 1→0. In response to these transitions, the output of multi-input logic gate NAND4 will switch from 0→1 at the commencement of the second portion of the pull-up time interval, to turn-off PMOS pull-up transistor P2 and increase the effective resistance of the pull-up path after the voltage on the output signal line (DATA OUT) has increased to a level above $V_{IH}$. This increase in the resistance of the pull-up path lessens the degree to which supply/Vdd bounce fluctuations will be represented as noise on the output signal line (DATA OUT). Moreover, like the operation of the pull-down portion of the output buffer described with respect to FIG. 2, the use of direct feedback from the gate electrode of PMOS pull-up transistor P2 to the input of the second delay unit DELAY 2 facilitates smooth monotonic pull-up of the output signal line during the entire pull-up time interval.

Figure 3:
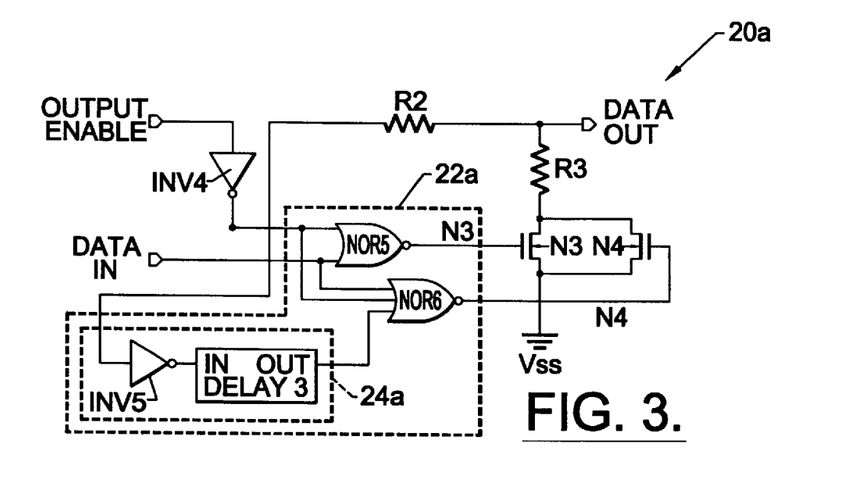
FIG. 3 is an electrical schematic of a pull-down circuit according to an embodiment of the present invention.
Figure 4:
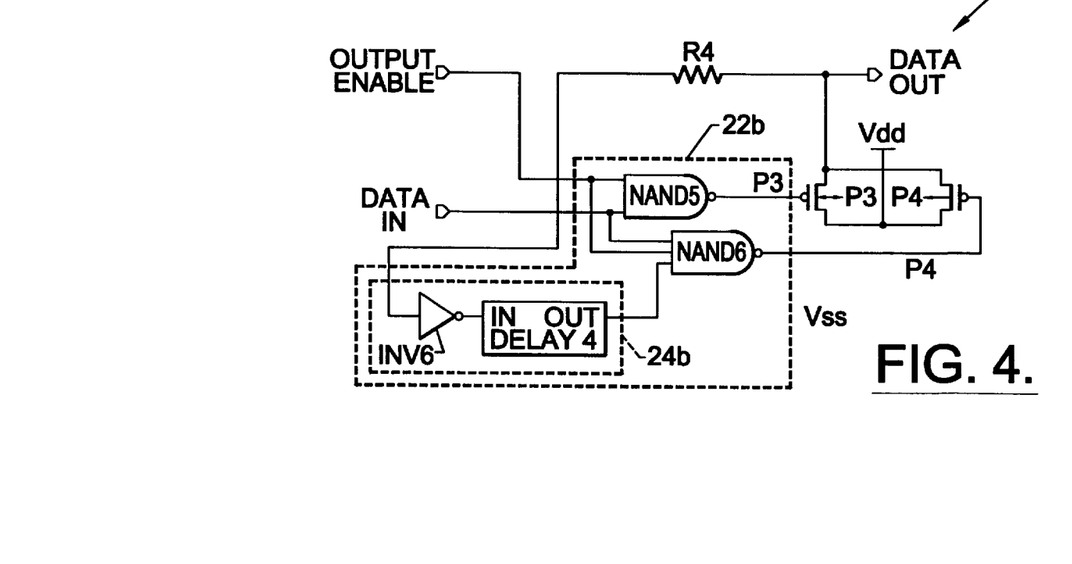
FIG. 4 is an electrical schematic of a pull-up circuit according to an embodiment of the present invention.

Referring now to FIGS. 3–4, an integrated circuit output buffer according to another embodiment of the present invention includes a pull-down circuit 20a and a pull-up circuit 20b. As illustrated, the pull-down circuit 20a includes first and second pull-down switches which are electrically connected in parallel. These first and second pull-down switches may comprise NMOS pull-down transistors N3 and N4 which are electrically connected to an output signal line (DATA OUT) by a resistor R3. This resistor R3 provides electrostatic discharge (ESD) protection and may have a value of 10Ω, for example. A pull-down control circuit 22a is also provided to control the turn-on and turn-off of the pull-down transistors N3 and N4 in such a manner to inhibit simultaneous-switching noise by reducing the degree of coupling between the output signal line (DATA OUT), and the first reference signal line Vss at the end of each pull-down transition. In particular, the pull-down control circuit 22a receives as an input a signal fed back through resistor R2 (e.g., 200Ω) from the output signal line (DATA OUT) to control the turn-off of NMOS pull-down transistor en N4 during a second portion of a pull-down time interval. However, because a pull-down transition of the output signal line during the pull-down time interval may not be entirely monotonic because of the presence of parasitic package and wire bond inductance, for example, the use of direct feedback from the output signal line to an input of the pull-down control circuit 22a may not be preferred since this feedback signal will also be influenced by any external parasitic inductance. Nonetheless, the pull-down circuit 20a may be used to inhibit simultaneous-switching noise in output buffers.

Operation of the pull-down circuit 20a of FIG. 3 will now be described in detail. Here, a quiescent DC condition can be initially established with the input signal line (DATA IN) set to a logic 1 level (while OUTPUT ENABLE=1). Once this condition has been established, the outputs of inverters INV4 and INV5, the outputs of the multi-input logic gates NOR5 and NOR6 and the output of the third delay device (DELAY 3) will all be set to logic 0 levels. Here, inverter INV5 and the third delay device (DELAY 3) collectively form a first inverting delay device 24a. If the input signal line (DATA IN) then transitions from 1→0, the pull-down control circuit 22a will initially turn on both of the pull-down transistors N3 and N4 during a first portion of a pull-down time interval by driving signal lines N3 and N4 from 0→1. Once the input signal line (DATA IN) initially transitions to a logic 0 level, all the inputs to the multi-input logic gates NOR5 and NOR6 will be set to logic 0 levels and the outputs of the pull-down control circuit 22a will be set to logic 1 levels. This action by the pull-down control circuit 22a results in the formation of a low resistance pull-down path between the output signal line (DATA OUT) and the reference signal line Vss. Accordingly, turn-on of the pull-down transistors N3 and N4 during a first portion of the pull-down time interval will cause the output signal line to transition from 1→0. Then, at some point during the first portion of the pull-down time interval, the output of inverter INV5 will switch from 0→1. In response to this transition in the output of INV5, the output of the third delay unit DELAY 3 will transition from 0→1 and the output of multi-input logic gate NOR6 will transition from 1→0 to turn off NMOS pull-down transistor N4 at the commencement of the second portion of the pull-down time interval. However, after completion of the pull-down time interval, NMOS pull-down transistor N3 remains conductive. The on-state resistance of NMOS pull-down transistor N3 and the value of resistor R3 can therefore be chosen to provided excellent impedance matching characteristics during DC operation.

Referring now specifically to FIG. 4, the pull-up circuit 20b includes first and second pull-up switches which are electrically connected in parallel. These first and second pull-up switches may comprise PMOS pull-up transistors P3 and P4 and a pull-up control circuit 22b to control the turn-on and turn-off of the pull-up transistors P3 and P4 in a manner which inhibits simultaneous-switching noise by reducing the degree of coupling between the output signal line (DATA OUT) and the supply line Vdd at the end of each pull-up transition. As illustrated, the pull-up control circuit 22b receives as an input a signal fed back through resistor R4 (e.g., 200Ω) from the output signal line (DATA OUT) to control the turn-off of PMOS pull-up transistor P4 during a second portion of a pull-up time interval. However, as described above with respect to the pull-down circuit 20a of FIG. 3, a pull-up transition of the output signal line during the pull-up time interval may not be entirely monotonic because of the presence of parasitic package and wire bond inductance, for example. Thus, the use of direct feedback from the output signal line to an input of the pull-up control circuit 22b may not be preferred since this feedback signal may also be influenced by any external parasitic inductance.

Operation of the pull-up circuit of FIG. 4 will now be described in detail. In this circuit, a quiescent DC condition can be initially established with the input signal line (DATA IN) set to a logic 0 level (while OUTPUT ENABLE=1). Once this condition has been established, the output of inverter INV6, the outputs of the multi-input logic gates NAND5 and NAND6 and the output of the fourth delay device (DELAY 4) will all be set to logic 1 levels. Here, inverter INV6 and the fourth delay device (DELAY 4) collectively form a second inverting delay device 24b. If the input signal line (DATA IN) then transitions from 0→1, the pull-up control circuit 22b will initially turn on both of the pull-up transistors P3 and P4 during a first portion of a pull-up time interval by driving signal lines P3 and P4 from 1→0. Accordingly, once the input signal line (DATA IN) initially transitions to a logic 1 level, all the inputs to the multi-input logic gates NAND5 and NAND6 will be set to logic 1 levels and the outputs of the pull-up control circuit 22b will be set to logic 0 levels. This action by the pull-up control circuit 22b results in the formation of a low resistance pull-up path between the output signal line (DATA OUT) and the supply line Vdd. Accordingly, turn-on of the pull-up transistors P3 and P4 during a first portion of the pull-up time interval will cause the output signal line to transition from 0→1. Then, at some point during the first portion of the pull-up time interval, the output of inverter INV6 will switch from 1→0. In response to this transition in the output of INV6, the output of the fourth delay unit DELAY 4 will transition from 1→0 and the output of multi-input logic gate NAND6 will transition from 0→1 to turn off PMOS pull-up transistor P4 at the commencement of the second portion of the pull-up time interval. Pull-up during the second portion of the pull-up time interval is then provided by the PMOS pull-up transistor P3 which may have an on-state resistance designed to provided impedance matching.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit output buffer, comprising:
   an output signal line;
   a reference signal line;
   a first switch having a first terminal electrically coupled to said output signal line and a second terminal electrically coupled to said reference signal line;
   a second switch having a first terminal electrically coupled to said output signal line and a second terminal electrically coupled to said reference signal line; and
   a control circuit which closes said first and second switches during a first portion of a pull-up/pull-down time interval and opens said second switch while maintaining said first switch closed during a second portion of the pull-up/pull-down time interval, said control circuit having a first output that is electrically coupled to an input of said first switch and a second output that is electrically coupled to an input of said second switch and is fed back as an input of said control circuit.

2. The buffer of claim 1, further comprising an ESD protection resistor electrically connected in series between the first terminal of said first switch and said output signal line.

3. The buffer of claim 2, wherein said first and second switches are electrically connected in parallel.

4. The buffer of claim 1, wherein each of said first and second switches comprises a transistor selected from the group consisting of NMOS and PMOS transistors.

5. The buffer of claim 4, wherein said first and second switches comprise transistors having different widths.

6. The buffer of claim 1, wherein said control circuit comprises:
   a latch; and
   a delay device having an input electrically coupled to the input of said second switch and an output electrically coupled to a first input of said latch.

7. The buffer of claim 6, wherein said control circuit comprises:
   a first multi-input logic gate having an output electrically coupled to an input of said first switch, said first multi-input logic gate selected from the group consisting of NOR gates and NAND gates; and
   a second multi-input logic gate having an output electrically coupled to the input of said second switch, said second multi-input logic gate selected from the group consisting of NOR gates and NAND gates.

8. The buffer of claim 7, further comprising:
   an input signal line electrically coupled to a first input of said first multi-input logic gate and a first input of said second multi-input logic gate.

9. The buffer of claim 8, wherein said input signal line is electrically coupled to a second input of said latch.

10. The buffer of claim 9, wherein a second input of said first multi-input logic gate, a second input of said second multi-input logic gate and a third input of said latch are electrically coupled to a first control signal line.

11. The buffer of claim 10, further comprising an inverter having an input electrically connected to an output of said latch and an output electrically connected to a third input of said second multi-input logic gate.

12. The buffer of claim 11, wherein said latch comprises a two-input logic gate and a three-input logic gate; wherein an output of the two-input logic gate is electrically connected to a first input of the three-input logic gate; and wherein an output of the three-input logic gate is electrically connected to a first input of the two-input logic gate.

13. The buffer of claim 12, wherein a second input of the two-input logic gate is electrically connected to the output of the delay device; wherein a second input of the three-input logic gate is electrically connected to the input signal line; and wherein a third input of the three-input logic gate is electrically connected to the first control signal line.

14. An integrated circuit output buffer, comprising:
   an output signal line;
   first and second reference signal lines;
   first and second pull-down switches which each have a first terminal electrically coupled to said output signal line and a second terminal electrically coupled to said first reference signal line;

first and second pull-up switches which each have a first terminal electrically coupled to said output signal line and a second terminal electrically coupled to said second reference signal line;

a pull-down control circuit which closes said first and second pull-down switches during a first portion of a pull-down time interval and uses a signal fed back from an input of said second pull-down switch to open said second pull-down switch while maintaining said first pull-down switch closed during a second portion of the pull-down time interval; and a pull-up control circuit which closes said first and second pull-up switches during a first portion of a pull-up time interval and uses a signal fed back from an input of said second pull-up switch to open said second pull-up switch while maintaining said first pull-up switch closed during a second portion of the pull-up time interval.

15. The buffer of claim 14, wherein a first output of said pull-down control circuit is electrically coupled to an input of said first pull-down switch; and wherein an input and a second output of said pull-down control circuit are both electrically coupled to an input of said second pull-down switch.

16. The buffer of claim 14, further comprising an ESD protection resistor electrically connected in series between the first terminal of said first pull-down switch and said output signal line.

17. The buffer of claim 14, wherein said first and second pull-down switches are electrically connected in parallel and said first and second pull-up switches are electrically connected in parallel.

18. The buffer of claim 15, wherein a first output of said pull-up control circuit is electrically coupled to an input of said first pull-up switch; and wherein an input and a second output of said pull-up control circuit are both electrically coupled to an input of said second pull-up switch.

19. The buffer of claim 18, wherein each of said first and second pull-down switches comprises an NMOS transistor; and wherein each of said first and second pull-up switches comprises a PMOS transistor.

20. The buffer of claim 18, wherein said pull-down control circuit comprises:
a latch; and
a delay device having an input electrically coupled to the input of said second pull-down switch and an output electrically coupled to a first input of said-latch.

21. The buffer of claim 18, wherein said first and second pull-down switches comprise NMOS transistors having different widths; and wherein said first and second pull-up switches comprise PMOS transistors having different widths.

22. The buffer of claim 20, wherein said pull-down control circuit comprises:
a first multi-input NOR gate having an output electrically coupled to an input of said first pull-down switch; and
a second multi-input NOR gate having an output electrically coupled to the input of said second pull-down switch.

23. The buffer of claim 22, wherein said pull-up control circuit comprises:
a first multi-input NAND gate having an output electrically coupled to an input of said first pull-up switch; and
a second multi-input NAND gate having an output electrically coupled to the input of said second pull-up switch.

24. The buffer of claim 23, further comprising:
an input signal line electrically coupled to a first input of said first multi-input NOR gate, a first-input of said second multi-input NOR gate, a first input of said first multi-input NAND gate and a first input of said second multi-input NAND gate.

25. The buffer of claim 24, wherein said input signal line is electrically coupled to a second input of said latch.

26. The buffer of claim 25, wherein a second input of said first multi-input NOR gate, a second input of said second multi-input NOR gate and a third input of said latch are responsive to a complementary output enable signal.

27. The buffer of claim 26, further comprising an inverter having an input electrically connected to an output of said latch and an output electrically connected to a third input of said second multi-input NOR gate.

28. The buffer of claim 26, wherein a second input of said first multi-input NAND gate and a second input of said second multi-input NAND gate are responsive to an output enable signal.

29. The buffer of claim 27, wherein said latch comprises a two-input NOR gate and a three-input NOR gate; wherein an output of the two-input NOR gate is electrically connected to an input of the three-input NOR gate; and wherein an output of the three-input NOR gate is electrically connected to an input of the two-input NOR gate.

30. An integrated circuit output buffer, comprising:
an output signal line;
a first reference signal line;
first and second switches which each have a first terminal electrically coupled to said output signal line and a second terminal electrically coupled to said first reference signal line; and
a control circuit which closes said first and second switches during a first portion of a pull-up/pull-down time interval and uses a signal fed back from said output signal line to open said second switch while maintaining said first switch closed during a second portion of the pull-up/pull-down time interval, said control circuit comprising:
a first multi-input logic gate having an output electrically connected to the input of said first switch;
a second multi-input logic gate having an output electrically connected to the input of said second switch; and
an inverting delay device having an input electrically coupled to said output signal line and an output electrically coupled to an input of said second multi-input logic gate.

31. The buffer of claim 30, further comprising an input signal line electrically coupled to an input of said first multi-input logic gate and an input of said second multi-input logic gate.

32. The buffer of claim 30, further comprising an ESD protection resistor electrically connected in series between the first terminal of said first switch and said output signal line.

33. The buffer of claim 30, wherein a first output of said control circuit is electrically coupled to an input of said first switch; and wherein a second output of said control circuit is electrically coupled to an input of said second switch.

34. The buffer of claim 31, wherein said first and second multi-input logic gates are selected from the group consisting of NOR and NAND gates.

35. An integrated circuit output buffer, comprising:
first and second pull-down transistors;

an output signal line electrically coupled to a drain of said first pull-down transistor and a drain of said second pull-down transistor;

an input signal line; and a control circuit that turns on said first and second pull-down transistors during a first portion of a pull-down time interval and uses a signal fed back from said output signal line to at least partially turn off said second pull-down transistor during a second portion of the pull-down time interval, said control circuit comprising:

an inverter having an input electrically coupled to said output signal line;

a first multi-input logic gate having a first input electrically coupled to said input signal line and an output electrically coupled to a gate electrode of said first pull-down transistor; and a second multi-input logic gate having a first input electrically coupled to the first input of said first multi-input logic gate and an output electrically coupled to a gate electrode of said second pull-down transistor.

36. The buffer of claim 35, wherein a second input of said first multi-input logic gate and a second input of said second multi-input logic gate are both responsive to an output enable signal.

37. The buffer of claim 35, wherein an input of said second multi-input logic gate is responsive to a signal generated at an output of said inverter.

38. The buffer of claim 35, wherein said first multi-input logic gate comprises a two-input NOR gate; and wherein said second multi-input logic gate comprises a three-input NOR gate.

39. The buffer of claim 36, wherein a third input of said second multi-input logic gate is responsive to a signal generated at an output of said inverter.

40. The buffer of claim 39, further comprising a delay unit electrically connected in series between-the output of said inverter and the third input of said second multi-input logic-gate.

41. The buffer of claim 40, further comprising an ESD resistor electrically connected in series between the drain of said first pull-down transistor and said output signal line.

* * * * *